(12) United States Patent
Patel

(10) Patent No.: US 11,830,723 B2
(45) Date of Patent: Nov. 28, 2023

(54) HIGH LUMINANCE LIGHT EMITTING DEVICE AND METHOD FOR CREATING A HIGH LUMINANCE LIGHT EMITTING DEVICE

(71) Applicant: Lumileds LLC, San Jose, CA (US)

(72) Inventor: Amil Ashok Patel, Palo Alto, CA (US)

(73) Assignee: Lumileds LLC, San Jose, CA (US)

( * ) Notice: Subject to any disclaimer, the term of this patent is extended or adjusted under 35 U.S.C. 154(b) by 237 days.

(21) Appl. No.: 17/519,688

(22) Filed: Nov. 5, 2021

(65) Prior Publication Data

US 2022/0059732 A1 Feb. 24, 2022

Related U.S. Application Data

(62) Division of application No. 16/230,528, filed on Dec. 21, 2018, now Pat. No. 11,205,743.

(51) Int. Cl.
*H01L 33/00* (2010.01)
*H01L 33/50* (2010.01)
(Continued)

(52) U.S. Cl.
CPC .......... *H01L 33/502* (2013.01); *H01L 27/156* (2013.01); *H01L 33/007* (2013.01);
(Continued)

(58) Field of Classification Search
CPC ... H01L 33/502; H01L 27/156; H01L 33/007; H01L 33/32; H01L 33/62
See application file for complete search history.

(56) References Cited

U.S. PATENT DOCUMENTS

2009/0026908 A1* 1/2009 Bechtel ............... C04B 35/6265
313/110
2017/0084587 A1 3/2017 Hung et al.
(Continued)

FOREIGN PATENT DOCUMENTS

EP 2555262 A2 2/2013
WO 2007085977 A1 8/2007
(Continued)

*Primary Examiner* — Caleb E Henry
*Assistant Examiner* — Alexander Belousov
(74) *Attorney, Agent, or Firm* — Servilla Whitney LLC

(57) ABSTRACT

A light emitting device having first, second and third dimensions that are orthogonal may include a light emitting semiconductor device configured to emit light via a first surface in a plane formed by the first and second dimensions. The light emitting device may further include a wavelength converting structure disposed on the first surface of the light emitting semiconductor device, the wavelength converting structure extending beyond the light emitting semiconductor device in the first dimension and the light emitting semiconductor device extending beyond the wavelength converting structure in the second dimension. The light emitting device may further include one or more optical extraction features in at least one gap formed by the wavelength converting structure extending beyond the light emitting semiconductor structure in the first dimension and/or formed by the light emitting semiconductor structure extending beyond the wavelength converting structure in the second dimension.

10 Claims, 13 Drawing Sheets

(51) Int. Cl.
  *H01L 33/62* (2010.01)
  *H01L 27/15* (2006.01)
  *H01L 33/32* (2010.01)

(52) U.S. Cl.
  CPC .............. *H01L 33/32* (2013.01); *H01L 33/62* (2013.01); *H01L 2933/0041* (2013.01); *H01L 2933/0066* (2013.01)

(56) References Cited

U.S. PATENT DOCUMENTS

2018/0226543 A1  8/2018  Masui et al.
2021/0050459 A1  2/2021  Kummerl et al.

FOREIGN PATENT DOCUMENTS

WO  2015011124 A1  1/2015
WO  2016094422 A1  6/2016

* cited by examiner

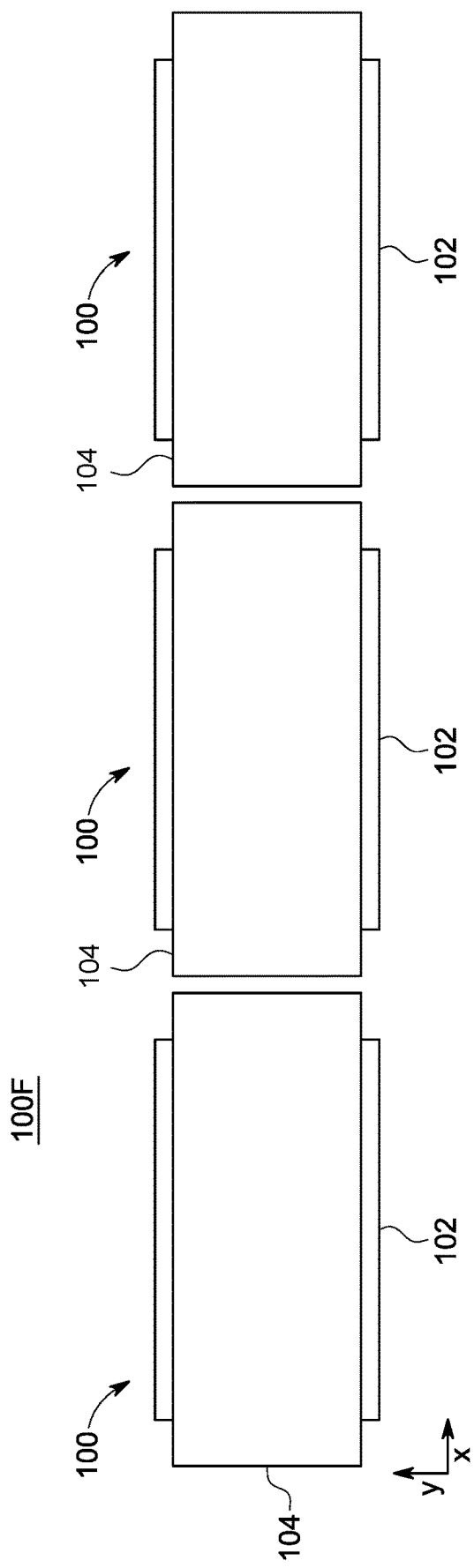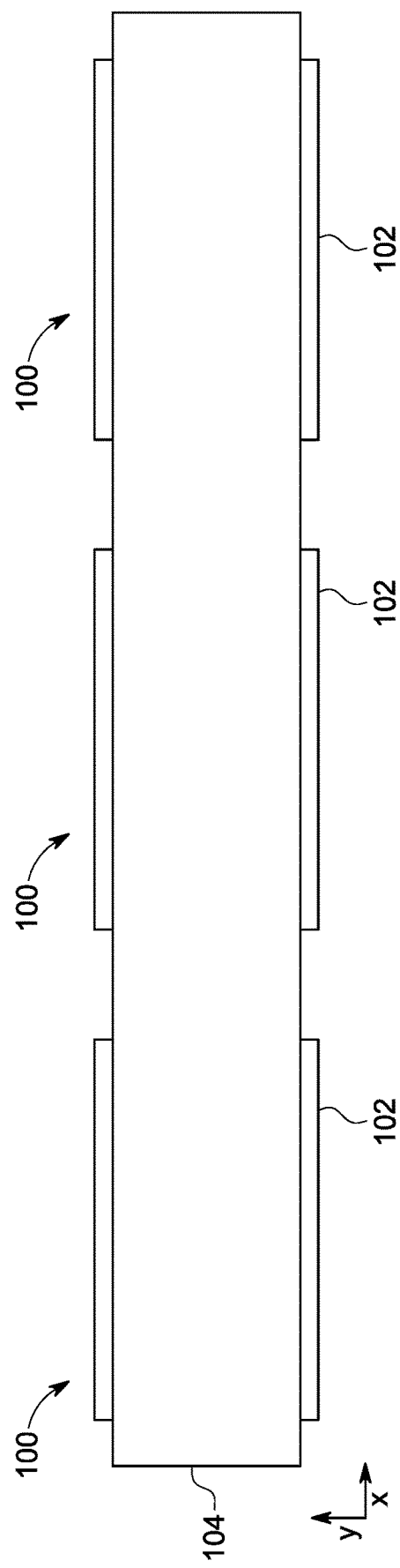

120

LED pump w/ sapphire

Screenprint Optically Clear material

Bond Phosphor Plate

130

LED pump w/ sapphire

Dispense Optically Clear material

Press and Bond Phosphor Plate
(Bonding material forms extraction features)

HIGH LUMINANCE LIGHT EMITTING DEVICE AND METHOD FOR CREATING A HIGH LUMINANCE LIGHT EMITTING DEVICE

CROSS-REFERENCE TO RELATED APPLICATIONS

This application is a Divisional of U.S. application Ser. No. 16/230,528, filed Dec. 21, 2018, the entire disclosure of which is hereby incorporated by reference herein.

FIELD OF INVENTION

This disclosure generally relates to light-emitting illumination devices, and more particularly to system and methods for light-emitting diodes (LEDs).

BACKGROUND

Light emitting diodes (LEDs) are used as sources of light for a variety of applications. For example, LEDs may be used as white light sources in various applications, such as flash sources for cellular telephone cameras and filament lamps. Such LEDs may be referred to herein as white LEDs or white-appearing LEDs. White LEDs may appear to emit white light from the perspective of the viewer when the LEDs are in an on state. In some cases, the white LEDs may be made up of light emitting semiconductor structures that emit non-white light as well as wavelength converting structures that make the non-white light appear white to the viewer. For example, a white LED may be formed from a blue light emitting semiconductor structure covered by a yellow emitting phosphor layer (i.e., the wavelength converting structure), and may be referred to as a phosphor-converted LED (pc-LED). Photons of blue light emitted by the light emitting semiconductor structure may either pass through the yellow emitting phosphor layer as blue photons or may be converted into yellow photons by the yellow emitting phosphor layer. The blue and yellow photons that are ultimately emitted out of the LED combine to make the light emitted from the LED appear white to the viewer.

SUMMARY

Light-emitting devices, and methods for creating light-emitting devices, are disclosed herein. A light emitting device having first, second and third dimensions that are orthogonal may include a light emitting semiconductor device configured to emit light via a first surface in a plane formed by the first and second dimensions. The light emitting device may further include a wavelength converting structure disposed on the first surface of the light emitting semiconductor device, the wavelength converting structure extending beyond the light emitting semiconductor device in the first dimension and the light emitting semiconductor device extending beyond the wavelength converting structure in the second dimension. The light emitting device may further include one or more optical extraction features in at least one gap formed by the wavelength converting structure extending beyond the light emitting semiconductor structure in the first dimension and/or formed by the light emitting semiconductor structure extending beyond the wavelength converting structure in the second dimension.

BRIEF DESCRIPTION OF THE DRAWINGS

FIG. 1F is a top view of an example array of light emitting devices;

FIG. 1G is a top view of an example array of light emitting devices;

DETAILED DESCRIPTION OF THE EMBODIMENTS

Figure 1A:
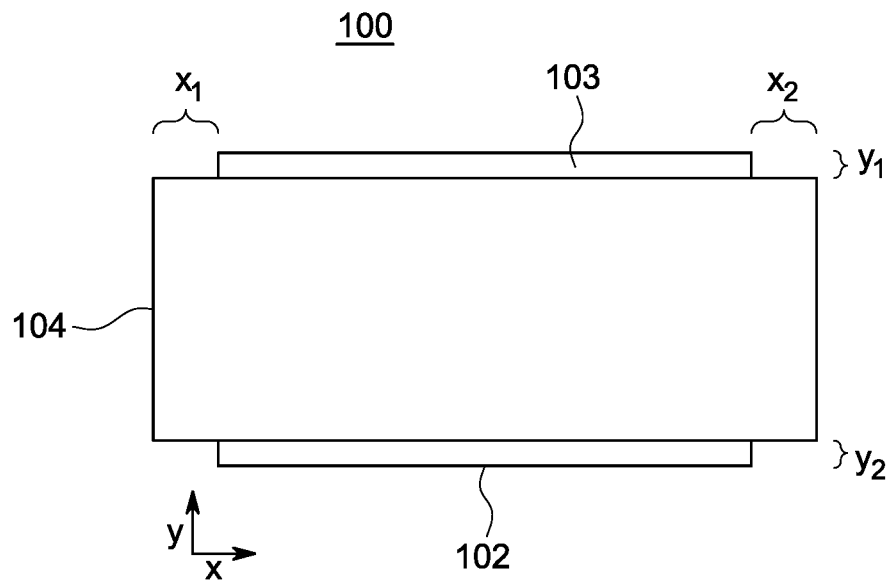
FIG. 1A is a top view of an example light emitting device.
Figure 1B:
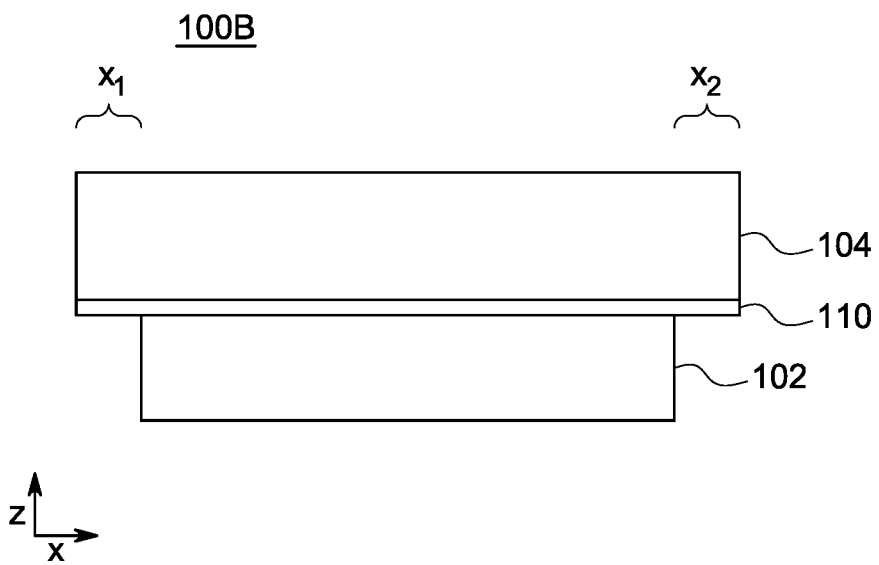
FIG. 1B is a cross sectional view of an example light emitting device.

Examples of different light illumination systems and/or light emitting diode implementations will be described more fully hereinafter with reference to the accompanying drawings. These examples are not mutually exclusive, and features found in one example may be combined with features found in one or more other examples to achieve additional implementations. Accordingly, it will be understood that the examples shown in the accompanying drawings are provided for illustrative purposes only and they are not intended to limit the disclosure in any way. Like numbers refer to like elements throughout.

It will be understood that, although the terms first, second, third, etc. may be used herein to describe various elements, these elements should not be limited by these terms. These terms may be used to distinguish one element from another. For example, a first element may be termed a second element and a second element may be termed a first element without departing from the scope of the present invention. As used herein, the term "and/or" may include any and all combinations of one or more of the associated listed items.

It will be understood that when an element such as a layer, region, or substrate is referred to as being "on" or extending "onto" another element, it may be directly on or extend directly onto the other element or intervening elements may also be present. In contrast, when an element is referred to as being "directly on" or extending "directly onto" another element, there may be no intervening elements present. It will also be understood that when an element is referred to as being "connected" or "coupled" to another element, it may be directly connected or coupled to the other element and/or connected or coupled to the other element via one or more intervening elements. In contrast, when an element is referred to as being "directly connected" or "directly coupled" to another element, there are no intervening elements present between the element and the other element. It will be understood that these terms are intended to encompass different orientations of the element in addition to any orientation depicted in the figures.

Relative terms such as "below," "above," "upper,", "lower," "horizontal" or "vertical" may be used herein to describe a relationship of one element, layer, or region to another element, layer, or region as illustrated in the figures. It will be understood that these terms are intended to encompass different orientations of the device in addition to the orientation depicted in the figures.

Semiconductor light emitting devices or optical power emitting devices, such as devices that emit ultraviolet (UV) or infrared (IR) optical power, are among the most efficient light sources currently available. These devices may include light emitting diodes, resonant cavity light emitting diodes, vertical cavity laser diodes, edge emitting lasers, or the like (hereinafter referred to as "LEDs"). Due to their compact size and lower power requirements, for example, LEDs may be attractive candidates for many different applications. For example, they may be used as light sources (e.g., flash lights and camera flashes) for hand-held battery-powered devices, such as cameras and cell phones. They may also be used, for example, for automotive lighting, heads up display (HUD) lighting, horticultural lighting, street lighting, torch for video, general illumination (e.g., home, shop, office and studio lighting, theater/stage lighting and architectural lighting), augmented reality (AR) lighting, virtual reality (VR) lighting, as back lights for displays, and IR spectroscopy. A single LED may provide light that is less bright than an incandescent light source, and, therefore, multi-junction devices or arrays of LEDs (such as monolithic LED arrays, micro LED arrays, etc.) may be used for applications where more brightness is desired or required.

Optical and lighting systems may require a small light emitting area to be emanated from the light emitting device (e.g., a light emitting diode (LED)), to improve coupling to the system optics and/or shrink the size of the system optics. In addition to needing a small light emitting area, it may be desirable for some optical and lighting systems to keep the area of the light emitting semiconductor large to enable higher current operation. Thus, methods are disclosed for creating light emitting devices that enable the decoupling of the dimensions of the light emitting surface (LES) defined by the wavelength converting structure (e.g., a ceramic phosphor plate or platelet) and the dimensions of the light emitting semiconductor structure (e.g., a blue light emitting (Gallium Nitride semiconductor=GaN) on sapphire die). The disclosed methods to create light emitting devices enable sizing of the wavelength converter to be smaller than light emitting semiconductor structure in at least one dimension, and/or larger than the light emitting semiconductor structure in at least one dimension. For example, a disclosed light emitting device has wavelength converting structure that is smaller (i.e., undersized) than light emitting semiconductor structure in one dimension (undersized) and larger (oversized) than light emitting semiconductor structure in the orthogonal dimension. A disclosed light emitting device may include optical extraction features (e.g., fillets) along the light emitting semiconductor structure and/or wavelength converting structure to increase overall light output and generate higher luminance. Details of the disclosed light emitting devices and disclosed methods for creating light emitting devices are described.

FIG. 1A is a top view of an example light emitting device 100 (in the x-y plane) including a light emitting semiconductor structure 102 (e.g., GaN on sapphire die) and an adjacent wavelength converting structure 104 (e.g., a yellow phosphor platelet). The wavelength converting structure 104 may be adjacent to a light emitting surface 103 of the light emitting semiconductor structure 102 in a two-dimensional plane (e.g., the x-y plane). The light emitting semiconductor structure 102 may be any light emitting device including, but not limited to, an LED chip or die, such as an LED die for flip chip. The wavelength converting structure 104 may be any wavelength converting layer that converts the wavelength of the light emitted from the light emitting semiconductor structure 102 including, but not limited to, a phosphor layer that comprises one or more types of phosphor (e.g., yellow, red, green/blue etc.), or a ceramic phosphor plate. The wavelength converting structure 104 may comprise for example a monolithic phosphor block, or a phosphor grains in a host matrix (e.g., a silicone matrix). According to the disclosures herein, a length of the wavelength converting structure 104 in a first dimension (e.g., along the x-axis as shown) is longer than the length of the light emitting semiconductor structure 102 in the first dimension and the length of the wavelength converting structure 104 in a second dimension (e.g., along the y-axis as shown) is shorter than the length of the light emitting semiconductor structure 102 in the second dimension. For example, the light emitting semiconductor structure 102 may extend beyond the wavelength converting structure 104 on each side by gaps of length $x_1$ and $x_2$ as shown, and the wavelength converting structure 104 may extend beyond the light emitting semiconductor structure 102 on each side by gaps of length $y_1$ and $y_2$ as shown. Any of the values of $x_1$, $x_2$, $y_1$, and $y_2$ may be the same or different (e.g., $x_1=x_2$ or $x_1 \neq x_2$, and/or $y_1=y_2$ or $y_1 \neq y_2$). In an example, the values of $x_1$, $x_2$, $y_1$, and $y_2$ may be in the range of 0.05 mm-0.15 mm for a light emitting semiconductor structure 102 with side lengths in the x and y dimensions in the range of 0.6 mm-0.8 mm. In another example, the x1 and x2 overhang lengths may be approximately equal to the thickness of the sapphire in the light emitting semiconductor structure 102. For example, the overhang lengths $x_1$ and $x_2$ (and/or $y_1$ and $y_2$) may be up to 20% of the die length in the light emitting semiconductor structure 102.

Figure 1C:
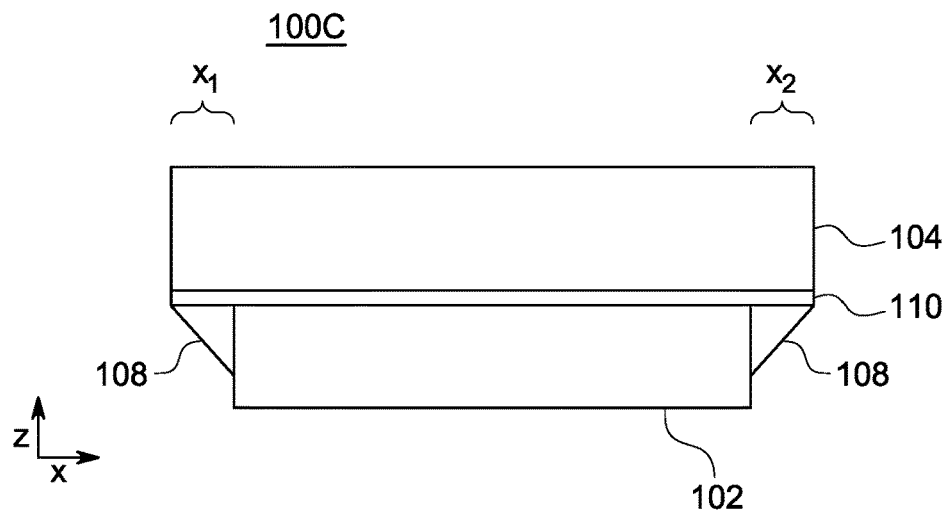
FIG. 1C is a cross sectional view of an example light emitting device.
Figure 1D:
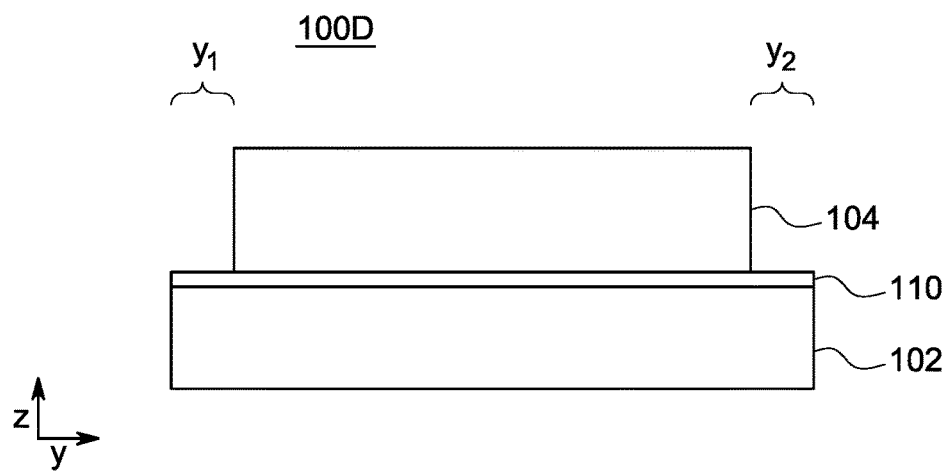
FIG. 1D is a cross sectional view of an example light emitting device.
Figure 1E:
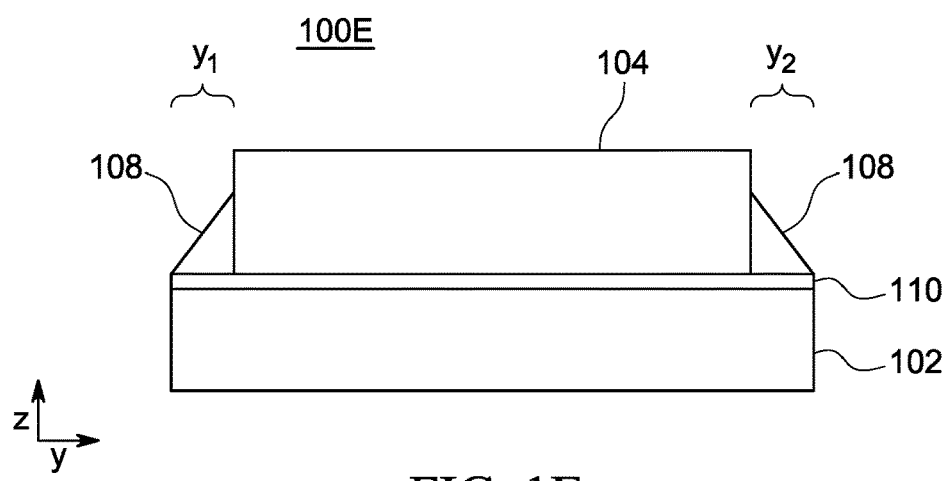
FIG. 1E is a cross sectional view of an example light emitting device.

FIGS. 1B-1E show cross sectional views of an example light emitting device 100 in the x-z plane (FIGS. 1B and 1C) or in the y-z plane (FIGS. 1D and 1E) including light emitting devices 100B-100E that may correspond to the light emitting device 100 in FIG. 1A. Each of the light emitting devices 100B-100E include an optically clear bonding layer 110 formed of an optically clear bonding material (e.g., glue made of silicone) to bond the wavelength converting structure 104 to the light emitting semiconductor structure 102. In FIGS. 1C and 1E, the light emitting devices 100C-100E further include optical extraction features 108. Any of the x cross-sections in FIGS. 1B and 1C may be combined with the any of the y cross-sections in FIGS. 1D and 1E. For example, a light emitting device 100 may have an x-cross section as in FIG. 1B and a y-cross section as in FIG. 1D. In another example, a light emitting device 100 may have an x-cross section as in FIG. 1B and a y-cross section as in FIG. 1E. In another example, a light emitting device 100 may have an x-cross section as in FIG. 1C and a y-cross section as in FIG. 1D. In another example, a light emitting device 100 may have an x-cross section as in FIG. 1C and a y-cross section as in FIG. 1E.

The optical extraction features 108 may be made from the same optical extraction material as the optically clear bonding layer 110 (for example, by pressing the wavelength converting material 104 onto the light emitting semiconductor structure 102 and squeezing out optical extraction material while bonding, as described below), or may be made from some other material (for example, by depositing some other material onto the surface, as described below). Examples of optical bonding material (bonding glue) include, but are not limited to, spin-on-glass or a silicone with a different refractive index (RI). The optical extraction features 108 may have any shape, for example a pyramid shape as shown, and may be linear, convex or concave. The extraction features 108 on either side of the the wavelength converting structure 104 and the light emitting semiconductor structure 102 may be symmetrical or may be different such as having same or different size, shape etc.

Figure 1M:
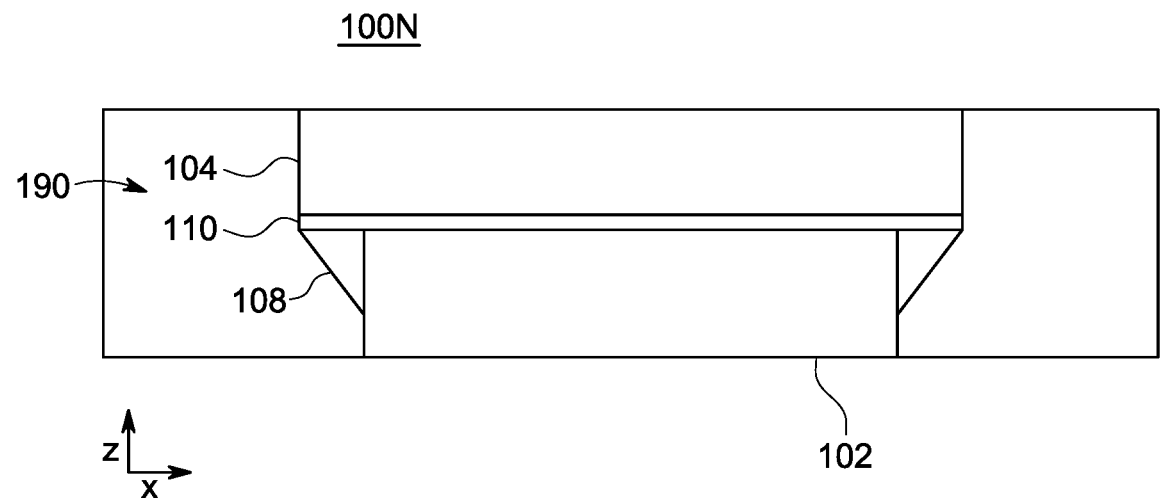
FIG. 1M is a cross sectional view of an example light emitting device.
Figure 1N:
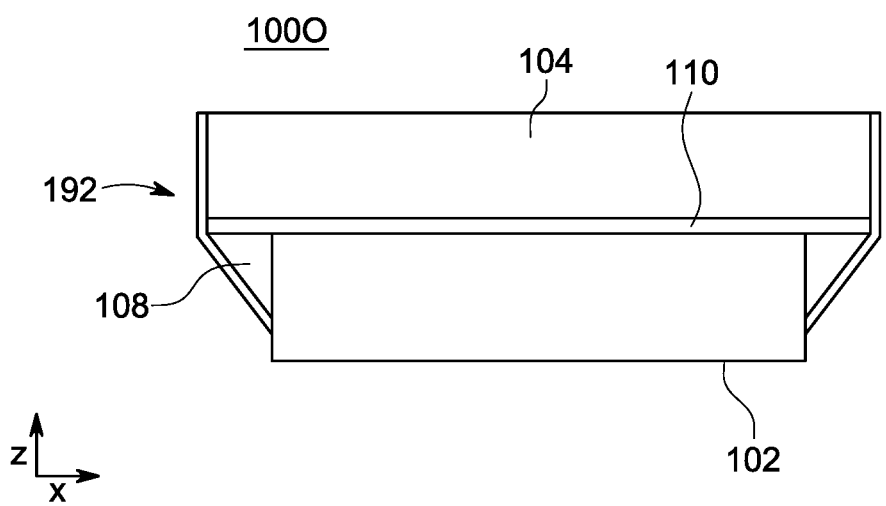
FIG. 1N is a cross sectional view of an example light emitting device.
Figure 2A:
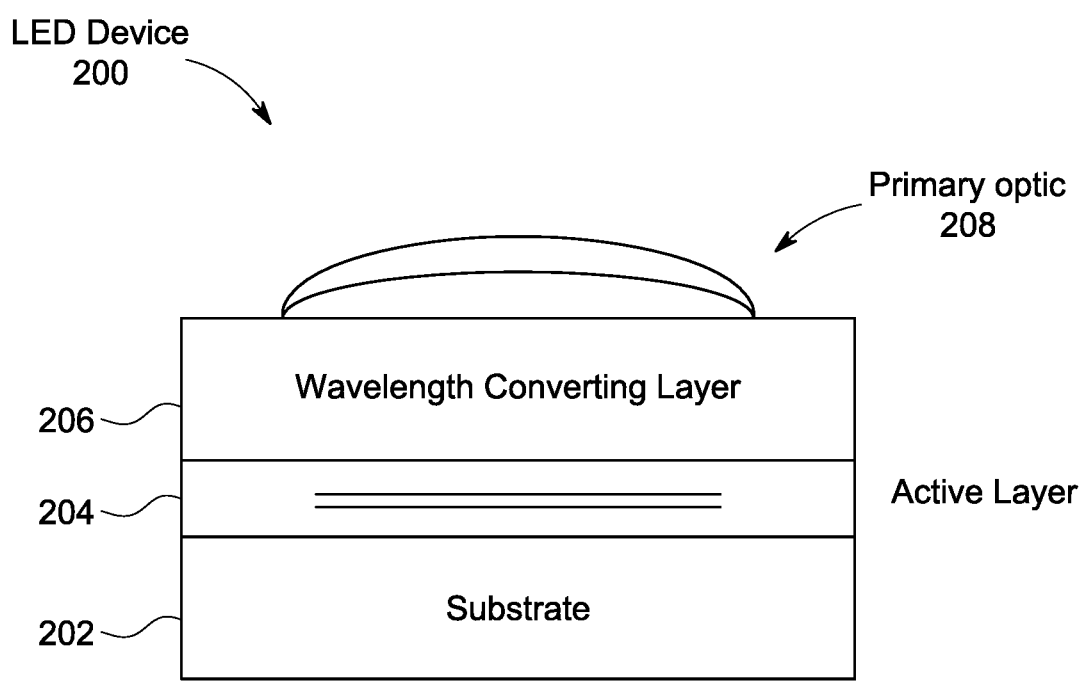
FIG. 2A is a diagram showing an Light Emitting Diode (LED) device.

The disclosed light emitting device, as shown in FIGS. 1A-1E, includes a wavelength converter that is smaller than the LED die in one dimension and the wavelength converter that is larger than the LED die in the orthogonal dimension. The disclosed light emitting device, as shown in FIGS. 1A-1E, may include other components and layers not shown. For example, the disclosed light emitting device, as shown in FIGS. 1A-1E, may further include a diffuse (scattering) reflector 190 (e.g., made of silicone with $TiO_2$ filler), as shown in FIG. 1M, and/or a specular reflector or dielectric mirror coating 192 (e.g., made of metal (Al, Ag)), as shown in FIG. 1N. The disclosed light emitting devices may further include components as shown in FIG. 2A, for example.

Light emitting devices with features as disclosed in any one or more of FIGS. 1A-1E may be used in creating high aspect ratio light sources by arraying the primitive light emitting devices, as shown in FIGS. 1F and 1G. FIGS. 1F and 1G show arrays 100F and 100G, respectively, of light emitting devices 100. Although three light emitting devices 100 are shown in one dimension (1D), any number of light emitting devices may be included in the a high aspect ratio light source array 100F or 100G; moreover, light source array 100F or 100G may be extended to two dimensions (2D). FIGS. 1F and 1G show top views of the arrays 100F and 100G, such that the arrays 100F and 100G may or may not include optical bonding material and/or optical extraction features according to examples shown in FIGS. 1A-1E.

FIG. 1F shows a high aspect ratio light source 100F formed of an array of light emitting devices $100_1$-$100_3$ each with the characteristics that the length of the wavelength converting structure 104 in a first dimension (e.g., along the x-axis as shown) is longer than the length of the light emitting semiconductor structure 102 in the first dimension and the length of the wavelength converting structure 104 in a second dimension (e.g., along the y-axis as shown) is shorter than the length of the light emitting semiconductor structure 102 in the second dimension. In FIG. 1G, a single continuous wavelength converting structure 102 is placed adjacent to and across the light emitting surfaces of all light emitting semiconductor structures 102 in the array. The high aspect ratio light source arrays 100F or 100G may be created using similar methods of creation described in FIGS. 1H, 1I, and 1J but applied to multiple light emitting devices and/or multiple light emitting semiconductor structures instead of a single light emitting device or light emitting semiconductor structure.

The optical extraction features (e.g., glue fillets) can be created using any of the following methods. For example, glue may be applied to the die in any one or more of the gaps formed by the extended portion(s) of the wavelength converter and/or the light emitting semiconductor structure. The wavelength converter platelet may be placed on the LED die. The glue is squeezed out in a way the forms optical extractions features below the wavelength converter platelet in the oversized dimension and/or above the LED die in the undersized dimension. The shape of the optical extractions features may be influenced by the glue properties, such as the viscosity and/or volume of the glue, and the pressure applied during platelet attachment.

Figure 1H:
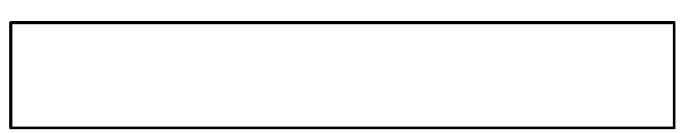
FIG. 1H is an example method for creating a light emitting device.
Figure 1H:
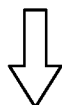
Figure 1H:
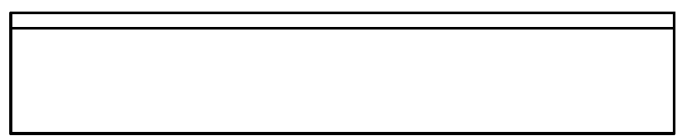
Figure 1H:
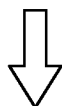
Figure 1H:
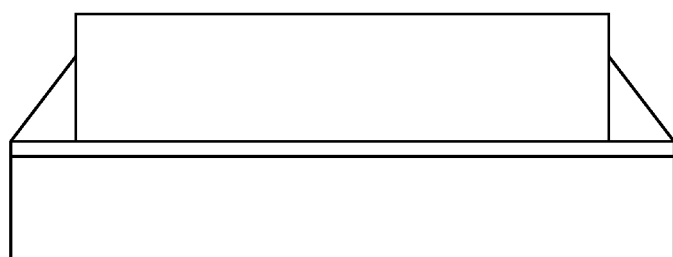

FIG. 1H shows an example method 120 for creating a light emitting device starting with a light emitting semiconductor structure, 122 (e.g., an LED pump with sapphire). At 124, an optically clear bonding material is screen-printed onto a first surface of the light emitting semiconductor device, the first surface being in a plane in a first dimension and a second dimension orthogonal to the first dimension. At 126, a wavelength converting plate (e.g., phosphor plate) is bonded using the optically clear bonding material to the first surface of the light emitting semiconductor device, the wavelength converting plate extending beyond the light emitting semiconductor device in the first dimension and the light emitting semiconductor device extending beyond the wavelength converting plate in the first dimension.

Figure 1I:
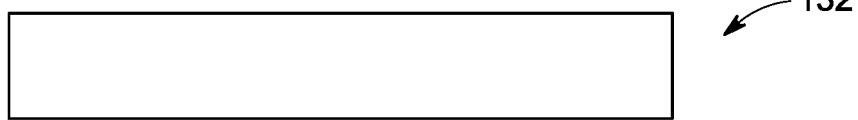
FIG. 1I is an example method for creating a light emitting device.
Figure 1I:
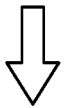
Figure 1I:
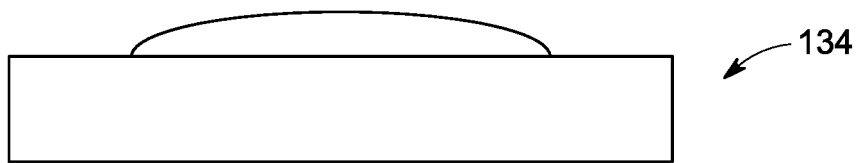
Figure 1I:
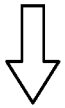
Figure 1I:
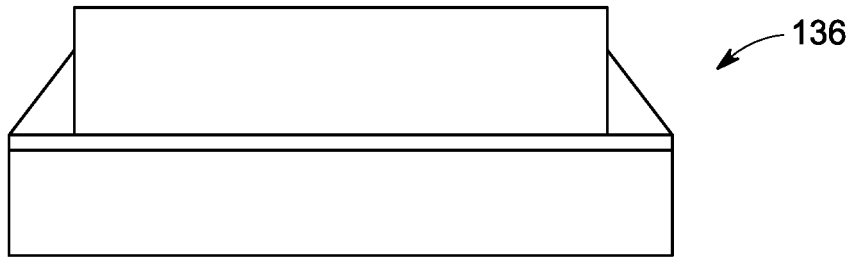

FIG. 1I shows another example method 130 for creating a light emitting device starting with a light emitting semiconductor structure, 132 (e.g., an LED pump with sapphire). At 134, an optically clear bonding material is dispensed onto a first surface of the light emitting semiconductor device, the first surface being in a plane in a first dimension and a second dimension orthogonal to the first dimension. At 136, a wavelength converting plate (e.g., phosphor plate) is pressed and bonded using the optically clear bonding material to the first surface of the light emitting semiconductor device, the wavelength converting plate extending beyond the light emitting semiconductor device in the first dimension and the light emitting semiconductor device extending beyond the wavelength converting plate in the first dimension and the bonding material forming optical extraction features in one or more of the gaps formed by the extended portions.

Figure 1J:
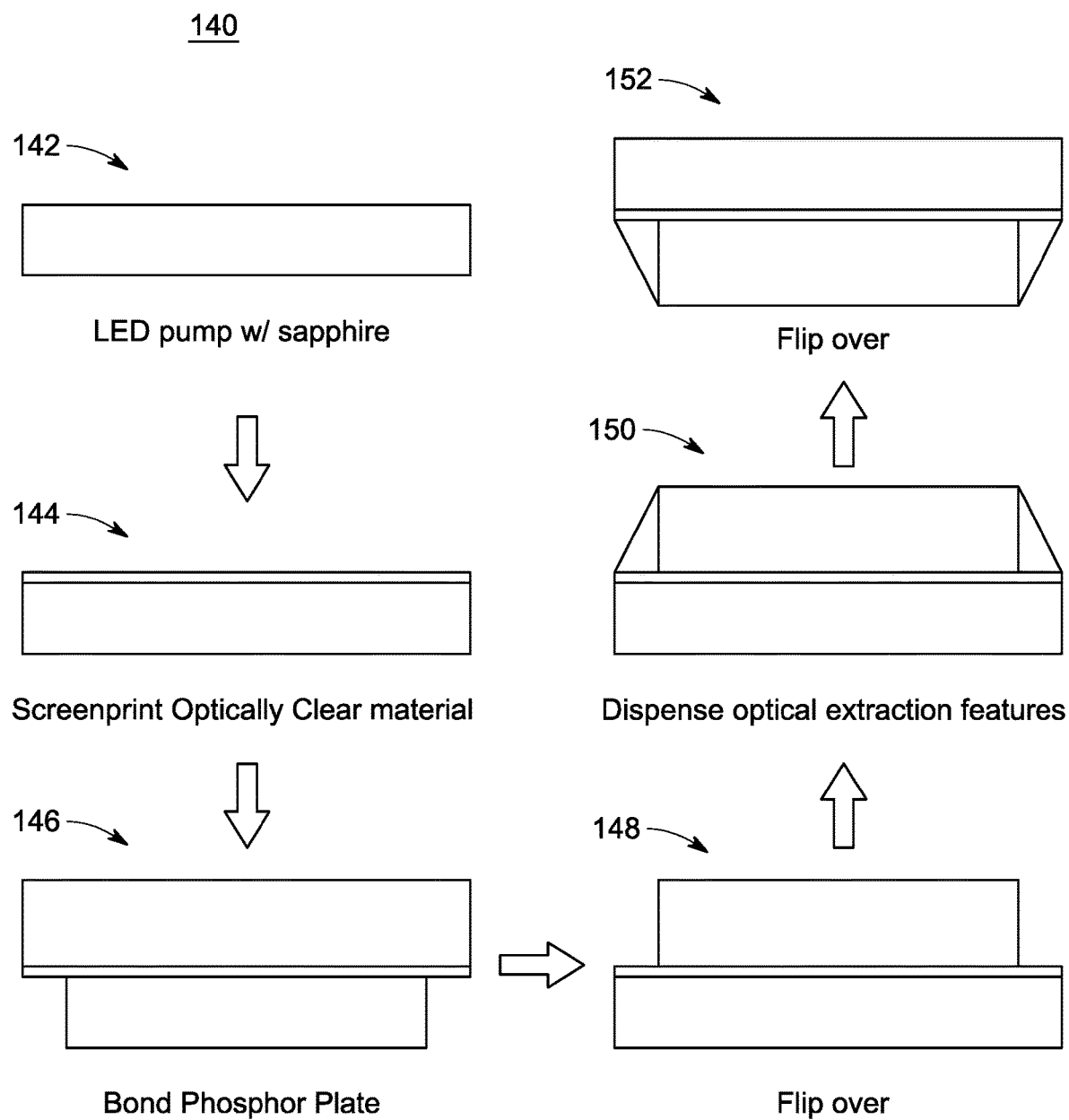
FIG. 1J is an example method for creating a light emitting device.

FIG. 1J shows another example method 140 for creating a light emitting device starting with a light emitting semiconductor structure, 142 (e.g., an LED pump with sapphire). At 144, an optically clear bonding material is screen-printed onto a first surface of the light emitting semiconductor device, the first surface being in a plane in a first dimension and a second dimension orthogonal to the first dimension. At 146, a wavelength converting plate (e.g., phosphor plate) is pressed and bonded using the optically clear bonding material to the first surface of the light emitting semiconductor device, the wavelength converting plate extending beyond the light emitting semiconductor device in the first dimension and the light emitting semiconductor device extending beyond the wavelength converting plate in the first dimension. At 148, the device may be flipped over and at 150 optical extractions features may be dispensed in one or more of the gaps formed by the extended portions. At 152, the device may be flipped again.

Example applications of the disclosed light emitting devices (LEDs), arrays of LEDs, and methods for creation thereof, include any application requiring high luminance lighting such as optics for automotive, camera flashes, lamp filaments, stage lighting, retail lighting spots, and video projectors.

Figure 1K:
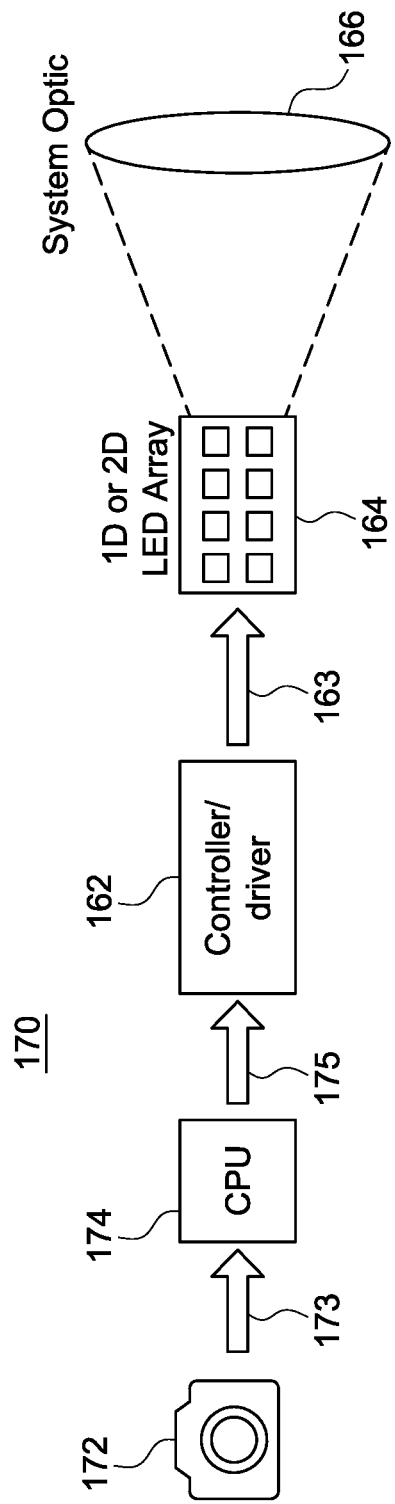
FIG. 1K is an example lighting system including a light emitting device array.

LEDs and LED arrays as disclosed herein are well suited for Adaptive Driving Beam (ADB) automotive headlamp systems, such as the example ADB automotive headlamp system 170 in FIG. 1K. The ADB system 170 may use a sensor suite (e.g., camera 172 and/or an accelerometer) to feed data 173 to a microprocessor 174 (central processing unit (CPU) to determine road conditions (e.g. hazards, oncoming traffic, pedestrians, etc.) in real time. The microprocessor 174 determines the best headlamp lighting conditions and sends instructions 175 to the LED controller/driver 162 that is capable of individually addressing LED pixels in a large 1D or 2D LED array 164, comprising LEDs as disclosed above. The driver 162 sends a combination signal 163 of pulse width, voltage and current to each LED pixel in the LED array 164. The light produced by the LED array 164 is coupled to the system optics 166 and projected onto the road. The LED light emitting area and die size of the LEDs in the LED array 164 can be optimized in conjunction with the system optics 166.

Figure 1L:
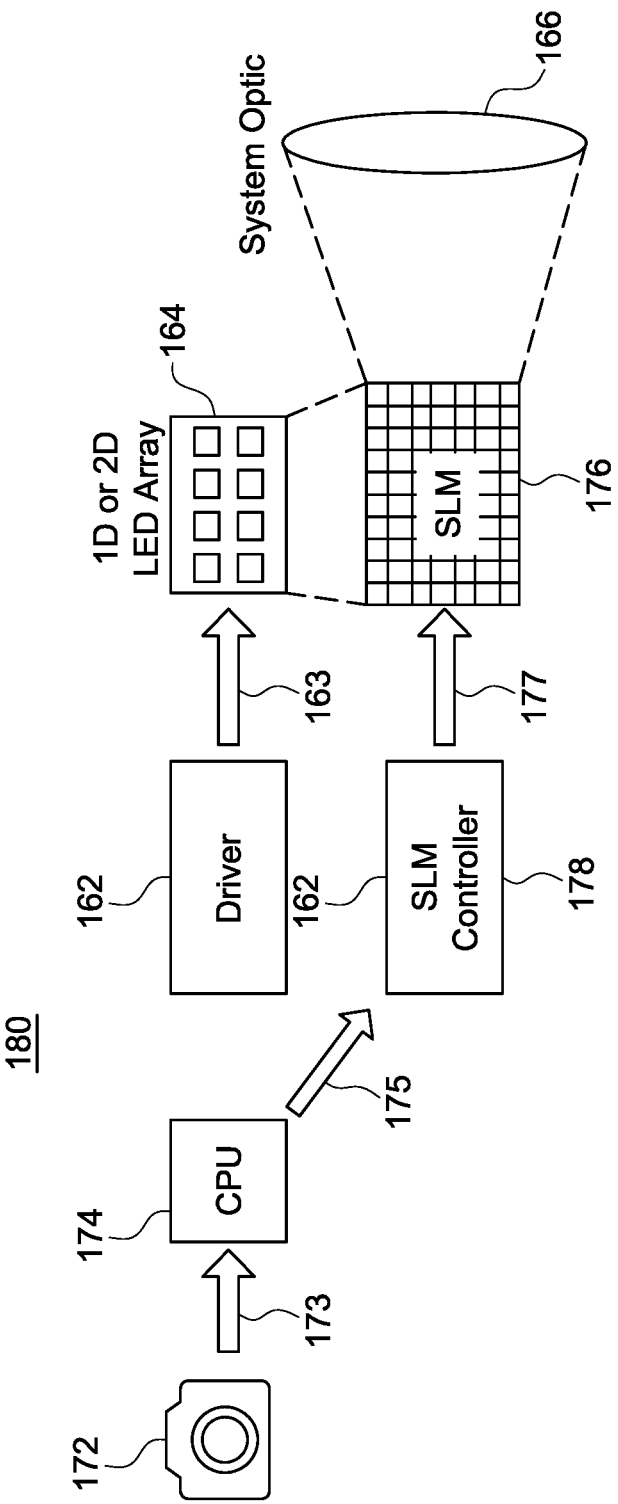
FIG. 1L is an example lighting system including a light emitting device array.

In another example of an ADB system 180 shown in FIG. 1L, a Spatial Light Modulator (SLM) 176 breaks up a beam generated by LED array 164 into individually addressable pixels. The microprocessor 174 directly sends the required illumination profile to the SLM controller 178. The SLM controller 178 sends the appropriate signals 177 to the SLM array 176. The LED array 164 is driven, by driver 162, at a fixed power 163 and is used to illuminate the SLM 176. The system optics 166 then project the image of the SLM 176. The LED light emitting area and die size in the LED array 164 can be optimized for best performance with the SLM 176.

The disclosed light emitting devices, arrays of LEDs, and methods for creation thereof, as described above, may be incorporated into any of the devices or systems shown in FIGS. 2A, 2B, 3, 4, and 5.

FIG. 2A is a diagram of an LED device 200 in an example embodiment. The LED device 200 may include a substrate 202, an active layer 204, a wavelength converting layer 206, and primary optic 208. In other embodiments, an LED device may not include a wavelength converter layer and/or primary optics.

As shown in FIG. 2A, the active layer 204 may be adjacent to the substrate 202 and emits light when excited. Suitable materials used to form the substrate 202 and the active layer 204 include sapphire, SiC, GaN, Silicone and may more specifically be formed from a III-V semiconductors including, but not limited to, AN, AlP, AlAs, AlSb, GaN, GaP, GaAs, GaSb, InN, InP, InAs, InSb, II-VI semiconductors including, but not limited to, ZnS, ZnSe, CdSe, CdTe, group IV semiconductors including, but not limited to Ge, Si, SiC, and mixtures or alloys thereof.

The wavelength converting layer 206 may be remote from, proximal to, or directly above active layer 204. The active layer 204 emits light into the wavelength converting layer 206. The wavelength converting layer 206 acts to further modify wavelength of the emitted light by the active layer 204. LED devices that include a wavelength converting layer are often referred to as phosphor converted LEDs ("PCLED"). The wavelength converting layer 206 may include any luminescent material, such as, for example, phosphor particles in a transparent or translucent binder or matrix, or a ceramic phosphor element, which absorbs light of one wavelength and emits light of a different wavelength.

The primary optic 208 may be on or over one or more layers of the LED device 200 and allow light to pass from the active layer 204 and/or the wavelength converting layer 206 through the primary optic 208. The primary optic 208 may be a lens or encapsulate configured to protect the one or more layers and to, at least in part, shape the output of the LED device 200. Primary optic 208 may include transparent and/or semi-transparent material. In example embodiments, light via the primary optic may be emitted based on a Lambertian distribution pattern. It will be understood that one or more properties of the primary optic 208 may be modified to produce a light distribution pattern that is different than the Lambertian distribution pattern. In an example embodiment, the LED device 200 may be the LED device and accordingly have the relative dimensions as disclosed in FIGS. 1A-1E.

Figure 2B:
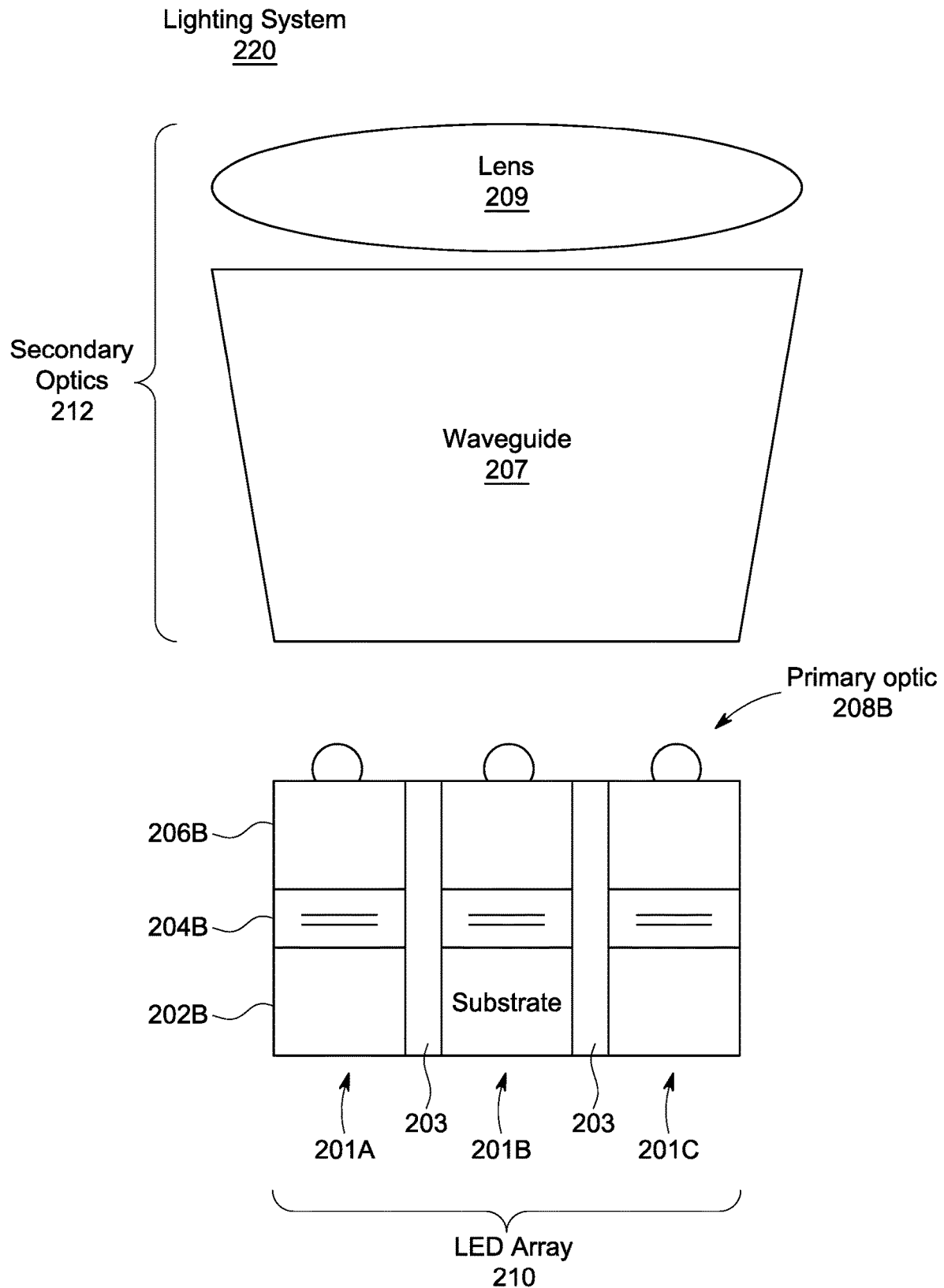
FIG. 2B is a diagram showing multiple LED devices.

FIG. 2B shows a cross-sectional view of a lighting system 220 including an LED array 210 with pixels 201A, 201B, and 201C, as well as secondary optics 212 in an example embodiment. In an example embodiment, the LED array 210 may be the LED array 100F of FIG. 1F or the LED array 100G of FIG. 1G. The LED array 210 includes pixels 201A, 201B, and 201C each including a respective wavelength converting layer 206B active layer 204B and a substrate 202B. The LED array 210 may be a monolithic LED array manufactured using wafer level processing techniques, a micro LED with sub-500 micron dimensions, or the like. Pixels 201A, 201B, and 201C, in the LED array 210 may be formed using array segmentation, or alternatively using pick and place techniques.

The spaces 203 shown between one or more pixels 201A, 201B, and 201C of the LED devices 200B may include an air gap or may be filled by a material such as a metal material which may be a contact (e.g., n-contact).

The secondary optics 212 may include one or both of the lens 209 and waveguide 207. It will be understood that although secondary optics are discussed in accordance with the example shown, in example embodiments, the secondary optics 212 may be used to spread the incoming light (diverging optics), or to gather incoming light into a collimated beam (collimating optics). In example embodiments, the waveguide 207 may be a concentrator and may have any applicable shape to concentrate light such as a parabolic shape, cone shape, beveled shape, or the like. The waveguide 207 may be coated with a dielectric material, a metallization layer, or the like used to reflect or redirect incident light. In alternative embodiments, a lighting system may not include one or more of the following: the wavelength converting layer 206B, the primary optics 208B, the waveguide 207 and the lens 209.

Lens 209 may be formed form any applicable transparent material such as, but not limited to SiC, aluminum oxide, diamond, or the like or a combination thereof. Lens 209 may be used to modify the a beam of light input into the lens 209 such that an output beam from the lens 209 will efficiently meet a desired photometric specification. Additionally, lens 209 may serve one or more aesthetic purpose, such as by determining a lit and/or unlit appearance of the p 201A, 201B and/or 201C of the LED array 210.

Figure 3:
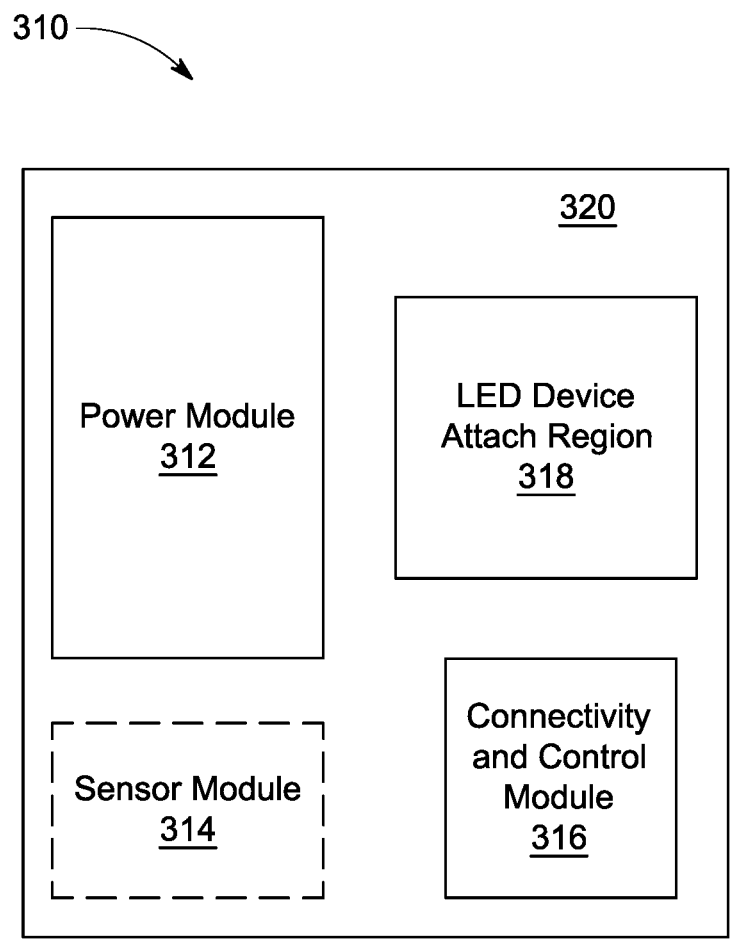
FIG. 3 is a top view of an electronics board for an integrated LED lighting system according to one embodiment.

FIG. 3 is a top view of an electronics board 310 for an integrated LED lighting system according to one embodiment. In alternative embodiments, two or more electronics boards may be used for the LED lighting system. For example, the LED array (e.g., the LED array 100F of FIG. 1F or the LED array 100G of FIG. 1G) may be on a separate electronics board, or the sensor module may be on a separate electronics board. In the illustrated example, the electronics board 310 includes a power module 312, a sensor module 314, a connectivity and control module 316 and an LED attach region 318 reserved for attachment of an LED array to a substrate 320.

The substrate 320 may be any board capable of mechanically supporting, and providing electrical coupling to, electrical components, electronic components and/or electronic modules using conductive connecters, such as tracks, traces, pads, vias, and/or wires. The power module 312 may include electrical and/or electronic elements. In an example embodiment, the power module 312 includes an AC/DC conversion circuit, a DC/DC conversion circuit, a dimming circuit, and an LED driver circuit.

The sensor module 314 may include sensors needed for an application in which the LED array is to be implemented.

The connectivity and control module 316 may include the system microcontroller and any type of wired or wireless module configured to receive a control input from an external device.

The term module, as used herein, may refer to electrical and/or electronic components disposed on individual circuit boards that may be soldered to one or more electronics boards 310. The term module may, however, also refer to electrical and/or electronic components that provide similar functionality, but which may be individually soldered to one or more circuit boards in a same region or in different regions.

Figure 4:
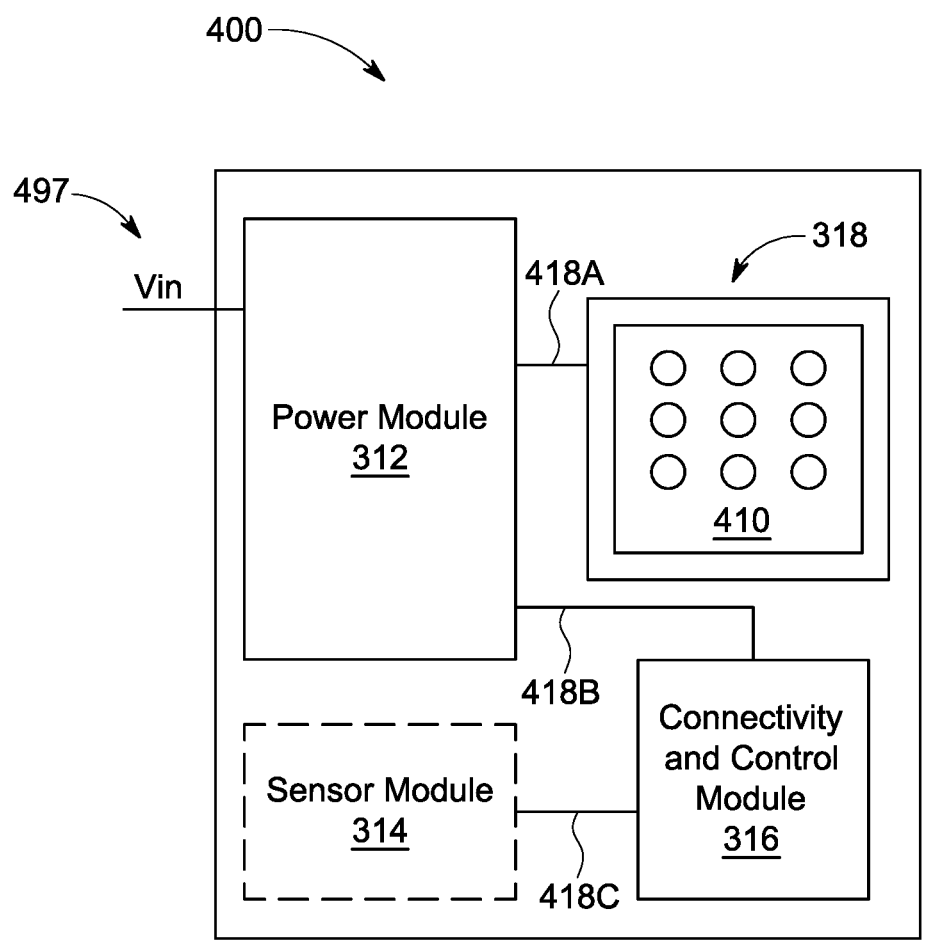
FIG. 4 is a top view of the electronics board with LED array attached to the substrate at the LED device attach region in one embodiment.

In an example, one or more LEDs, as disclosed herein, can be used individually or cascaded into an array (one-dimensional or two-dimensional) in an LED system and driven with a fixed power (voltage and Current). In an example, FIG. 4 is a top view of the electronics board 310 with an LED array 410 (e.g., the LED array 100F of FIG. IF or the LED array 100G of FIG. 1G) attached to the substrate 320 at the LED device attach region 318 in one embodiment. The electronics board 310 together with the LED array 410 represents an LED system 400. Additionally, the power module 312 receives a voltage input at Vin 497 and control signals from the connectivity and control module 316 over traces 418B, and provides drive signals to the LED array 410 over traces 418A. The LED array 410 is turned on and off via the drive signals from the power module 312. In the embodiment shown in FIG. 4, the connectivity and control module 316 receives sensor signals from the sensor module 314 over trace 418C.

According to embodiments, LED systems may be provided where an LED array is on a separate electronics board from the driver and control circuitry. According to other embodiments, a LED system may have the LED array together with some of the electronics on an electronics board separate from the driver circuit. For example, an LED system may include a power conversion module and an LED module located on a separate electronics board than the LED arrays.

According to embodiments, an LED system may include a multi-channel LED driver circuit. For example, an LED module may include embedded LED calibration and setting data and, for example, three groups of LEDs. One of ordinary skill in the art will recognize that any number of groups of LEDs may be used consistent with one or more applications. Individual LEDs within each group may be arranged in series or in parallel and the light having different color points may be provided. For example, warm white light may be provided by a first group of LEDs, a cool white light may be provided by a second group of LEDs, and a neutral white light may be provided by a third group.

Figure 5:
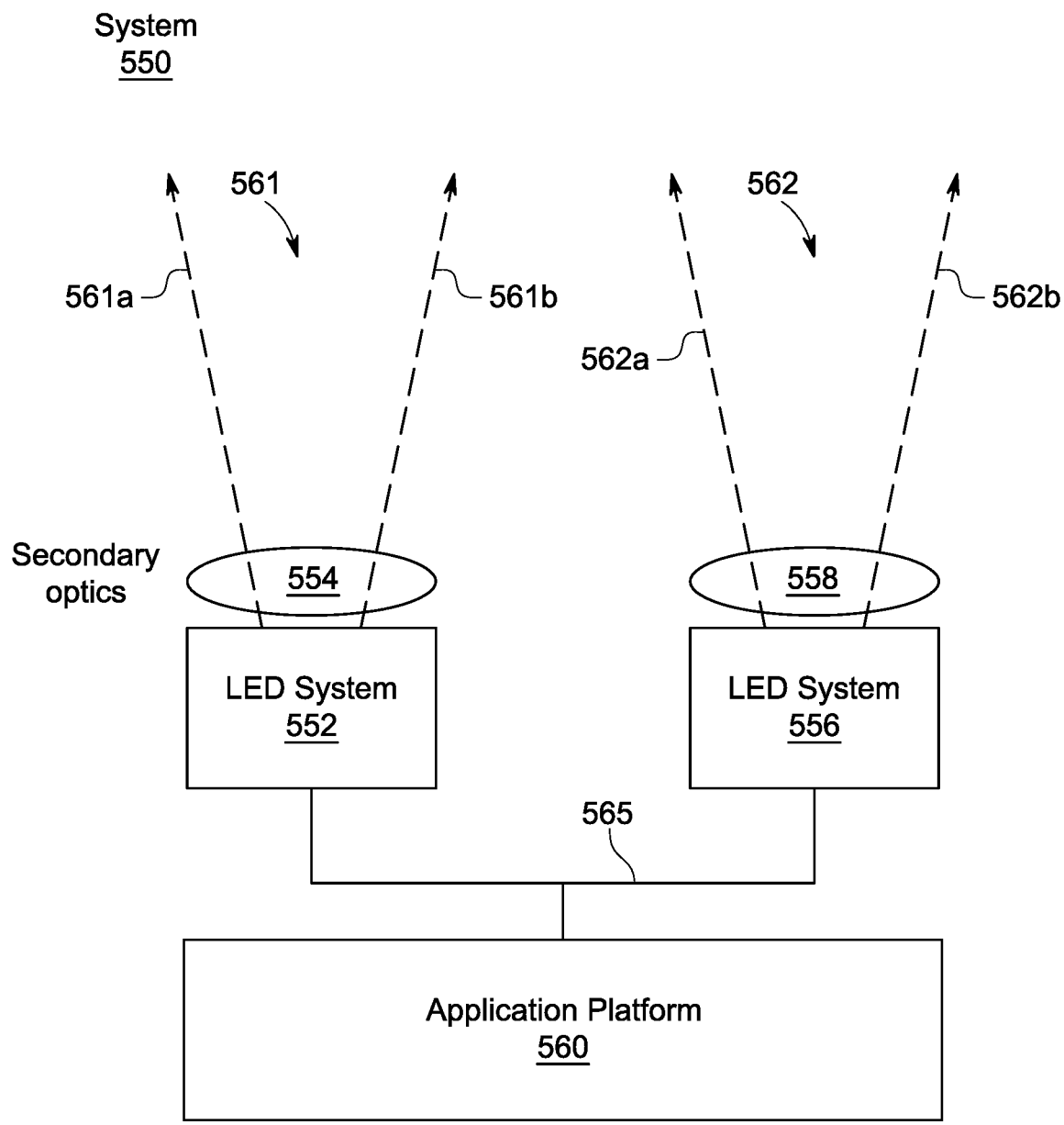
FIG. 5 is a diagram of an example application system.

FIG. 5 shows an example system 550 which includes an application platform 560, LED systems 552 and 556 (which may comprise any of the LEDs or LED arrays disclosed herein), and secondary optics 554 and 558. The LED System 552 produces light beams 561 shown between arrows 561a and 561b. The LED System 556 may produce light beams 562 between arrows 562a and 562b. In the embodiment shown in FIG. 5, the light emitted from LED system 552 passes through secondary optics 554, and the light emitted from the LED System 556 passes through secondary optics 558. In alternative embodiments, the light beams 561 and 562 do not pass through any secondary optics. The secondary optics may be or may include one or more light guides. The one or more light guides may be edge lit or may have an interior opening that defines an interior edge of the light guide. LED systems 552 and/or 556 may be inserted in the interior openings of the one or more light guides such that they inject light into the interior edge (interior opening light guide) or exterior edge (edge lit light guide) of the one or more light guides. LEDs in LED systems 552 and/or 556 may be arranged around the circumference of a base that is part of the light guide. According to an implementation, the base may be thermally conductive. According to an implementation, the base may be coupled to a heat-dissipating element that is disposed over the light guide. The heat-dissipating element may be arranged to receive heat generated by the LEDs via the thermally conductive base and dissipate the received heat. The one or more light guides may allow light emitted by LED systems 552 and 556 to be shaped in a desired manner such as, for example, with a gradient, a chamfered distribution, a narrow distribution, a wide distribution, an angular distribution, or the like.

In example embodiments, the system 550 may be a mobile phone of a camera flash system, indoor residential or commercial lighting, outdoor light such as street lighting, an automobile, a medical device, AR/VR devices, and robotic devices. The integrated LED lighting system shown in FIG. 3, LED System 400 shown in FIG. 4, illustrate LED systems 552 and 556 in example embodiments.

In example embodiments, the system 550 may be a mobile phone of a camera flash system, indoor residential or commercial lighting, outdoor light such as street lighting, an automobile, a medical device, AR/VR devices, and robotic devices. The LED System 400 shown in FIG. 4 illustrates LED systems 552 and 556 in example embodiments.

The application platform 560 may provide power to the LED systems 552 and/or 556 via a power bus via line 565 or other applicable input, as discussed herein. Further, application platform 560 may provide input signals via line 565 for the operation of the LED system 552 and LED system 556, which input may be based on a user input/preference, a sensed reading, a pre-programmed or autonomously determined output, or the like. One or more sensors may be internal or external to the housing of the application platform 560.

In various embodiments, application platform 560 sensors and/or LED system 552 and/or 556 sensors may collect data such as visual data (e.g., LIDAR data, IR data, data collected via a camera, etc.), audio data, distance based data, movement data, environmental data, or the like or a combination thereof. The data may be related a physical item or entity such as an object, an individual, a vehicle, etc. For example, sensing equipment may collect object proximity data for an ADAS/AV based application, which may prioritize the detection and subsequent action based on the detection of a physical item or entity. The data may be collected based on emitting an optical signal by, for example, LED system 552 and/or 556, such as an IR signal and collecting data based on the emitted optical signal. The data may be collected by a different component than the component that emits the optical signal for the data collection. Continuing the example, sensing equipment may be located on an automobile and may emit a beam using a vertical-cavity surface-emitting laser (VCSEL). The one or more sensors may sense a response to the emitted beam or any other applicable input.

In example embodiment, application platform 560 may represent an automobile and LED system 552 and LED system 556 may represent automobile headlights. In various embodiments, the system 550 may represent an automobile with steerable light beams where LEDs may be selectively activated to provide steerable light. For example, an array of LEDs may be used to define or project a shape or pattern or illuminate only selected sections of a roadway. In an example embodiment, Infrared cameras or detector pixels within LED systems 552 and/or 556 may be sensors that identify portions of a scene (roadway, pedestrian crossing, etc.) that require illumination.

Having described the embodiments in detail, those skilled in the art will appreciate that, given the present description, modifications may be made to the embodiments described herein without departing from the spirit of the inventive concept. Therefore, it is not intended that the scope of the invention be limited to the specific embodiments illustrated and described.

What is claimed is:

1. A method for creating a light emitting device, the method comprising:
   screen-printing an optically clear bonding layer onto a first surface of a light emitting semiconductor structure, the first surface being in a plane formed by a first dimension and a second dimension orthogonal to the first dimension, the light emitting semiconductor structure having a length extending in the first dimension and a length extending in the second dimension; and
   bonding a wavelength converting structure using an optically clear bonding layer to the first surface of the light emitting semiconductor structure, the wavelength converting structure having a length extending in the first dimension longer than the length of the light emitting semiconductor structure in the first dimension, and the wavelength converting structure having a length extending in the second dimension shorter than the length of the light emitting semiconductor structure in the second dimension.

2. The method of claim 1, further comprising:
   pressing while bonding the wavelength converting structure to the first surface of the light emitting semiconductor structure to form optical extraction features formed of the optically clear bonding layer in at least one gap formed by the wavelength converting structure extending beyond the light emitting semiconductor structure in the first dimension or the light emitting semiconductor structure extending beyond the wavelength converting structure in the second dimension.

3. The method of claim 2, further comprising:
   controlling a size of the optical extraction features by controlling an amount of pressure applied when pressing the wavelength converting structure.

4. The method of claim 1, further comprising:
   dispensing an optical extraction feature in at least one gap formed by the wavelength converting structure extending beyond the light emitting semiconductor structure in the first dimension or the light emitting semiconductor structure extending beyond the wavelength converting structure in the second dimension to form at least one optical extraction feature.

5. The method of claim 4, further comprising:
   flipping over the light emitting semiconductor structure and wavelength converting structure when dispensing the optical extraction feature.

6. The method of claim 4, further comprising:
   controlling a size of the at least one optical extraction feature by selecting the optical extraction material based on its viscosity and volume.

7. A method for creating an array of light emitting devices, the method comprising:
   screen-printing an optically clear bonding layer onto a first surface of each of a plurality of light emitting semiconductor structures, the first surface being in a plane in a first dimension and a second dimension orthogonal to the first dimension, each of the plurality of light emitting semiconductor structures having a length extending in the first dimension and a length extending in the second dimension;
   arranging the plurality of light emitting semiconductor structures linearly along the first dimension to form a linear array of light emitting semiconductor structures; and
   bonding a wavelength converting structure using the optically clear bonding layer to the first surface of each of the plurality of light emitting semiconductor structures in the linear array of light emitting semiconductor structures, the wavelength converting structure having a length extending in the first dimension longer than the linear array of light emitting semiconductor structures, and the wavelength converting structure having a length extending in the second dimension shorter than the length of each of the plurality of light emitting semiconductor structures in the second dimension.

8. The method of claim 7, further comprising:
   pressing while bonding the wavelength converting structure to the first surface of each of the plurality of the light emitting semiconductor structure to form optical extraction features formed of the optically clear bonding layer 1 in at least one gap formed by the wavelength converting structure extending beyond the linear array of light emitting semiconductor structures in the first dimension or each of the plurality of the light emitting semiconductor structures extending beyond the wavelength converting structure in the second dimension.

9. The method of claim 7, further comprising:
   dispensing an optical extraction feature in at least one gap formed by the wavelength converting structure extending beyond the linear array of light emitting semiconductor structures in the first dimension or each of the plurality of the light emitting semiconductor structures extending beyond the wavelength converting structure in the second dimension.

10. The method of claim 9, further comprising:
    flipping over the linear array of light emitting semiconductor structures bonded to and wavelength converting structure when dispensing the optical extraction feature.

* * * * *